United States Patent
Tseng et al.

(10) Patent No.: US 12,204,248 B2
(45) Date of Patent: Jan. 21, 2025

(54) SURFACE CHARGE RELEASE IN LITHOGRAPHY DEVELOPING PROCESS

(71) Applicant: Taiwan Semiconductor Manufacturing Company, Ltd., Hsinchu (TW)

(72) Inventors: Yu-Ling Tseng, Hsinchu (TW); Kai-Lun Tseng, Hsinchu (TW); Yuan-Yen Lo, Taipei (TW); Pei-Kao Li, Hsinchu (TW); Cheng Yu Wu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 205 days.

(21) Appl. No.: 17/410,005

(22) Filed: Aug. 24, 2021

(65) Prior Publication Data
US 2022/0365439 A1 Nov. 17, 2022

Related U.S. Application Data

(60) Provisional application No. 63/188,230, filed on May 13, 2021.

(51) Int. Cl.
*G03F 7/38* (2006.01)
*G03F 7/32* (2006.01)

(52) U.S. Cl.
CPC ............... *G03F 7/38* (2013.01); *G03F 7/327* (2013.01)

(58) Field of Classification Search
CPC .......... G03F 7/38; G03F 7/327; G03F 7/3021; G03F 7/322; G03F 7/30; H01L 21/67051; H05F 3/02
See application file for complete search history.

(56) References Cited

U.S. PATENT DOCUMENTS 5,175,124 A * 12/1992 Winebarger ...... H01L 21/02071
430/311
6,159,662 A * 12/2000 Chen .................... G03F 7/3021
430/313

(Continued)

OTHER PUBLICATIONS

Nichias Corporation, Tombo Brand Naflon Tubing Fluoropolymer Products, Mar. 2020 (Year: 2020).*

(Continued)

*Primary Examiner* — Mark F. Huff
*Assistant Examiner* — Moriah S. Smoot
(74) *Attorney, Agent, or Firm* — Lippes Mathias LLP (57) ABSTRACT

In semiconductor manufacturing, deionized (DI) water or another process fluid is flowed through a nonmetallic pipe and onto a semiconductor wafer. Static electric charge is discharged from the DI water or other process fluid flowing through the nonmetallic pipe via an electrically conductive material disposed on an outside of the nonmetallic pipe. The electrically conductive material disposed on the outside of the nonmetallic pipe is electrically grounded. The nonmetallic pipe may comprise fluoropolymer (PFA) based tubing. In some embodiments, the nonmetallic pipe includes: a PFA-NE pipe connected with a chamber or housing containing the wafer, and a second pipe connected with the PFA-NE pipe by a pipe connector, in which the second pipe is more electrically insulating than the PFA-NE pipe.

20 Claims, 4 Drawing Sheets

(56) References Cited

U.S. PATENT DOCUMENTS

| | | | |
|---|---|---|---|
| 6,582,137 B1* | 6/2003 | Crabtree | H01L 21/02118 |
| | | | 257/E21.259 |
| 2017/0003256 A1* | 1/2017 | Ziegler | F16L 11/127 |
| 2019/0079409 A1* | 3/2019 | Takahashi | C11D 7/5009 |
| 2019/0337823 A1* | 11/2019 | Leys | B01D 63/067 |
| 2023/0063350 A1* | 3/2023 | Chuang | G01R 29/24 |

OTHER PUBLICATIONS

Caulfield et al. Reducing Electrostatic Discharge In Semiconductor Fluoropolymer Fluid Handling Systems While Maintaining Chemical Purity, Advanced Materials Handling: Technical Note, Entegris, Inc. 2016. (Year: 2016).*

Deming, Benjamin L., et al. "Measurements of delays of gas-phase compounds in a wide variety of tubing materials due to gas-wall interactions." Atmospheric Measurement Techniques 12.6 (2019): 3453-3461. (Year: 2019).*

Zhao, Shuai, et al. "Study on the atmospheric pressure homogeneous discharge in air assisted with a floating carbon fibre microelectrode." Europhysics Letters 130.6 (2020): 65001. (Year: 2020).*

* cited by examiner

SURFACE CHARGE RELEASE IN LITHOGRAPHY DEVELOPING PROCESS

This application claims the benefit of U.S. provisional application Ser. No. 63/188,230 filed May 13, 2021 and titled "SURFACE CHARGE RELEASE IN LITHOGRAPHY DEVELOPING PROCESS". U.S. provisional application Ser. No. 63/188,230 filed May 13, 2021 and titled "SURFACE CHARGE RELEASE IN LITHOGRAPHY DEVELOPING PROCESS" is incorporated herein by reference in its entirety.

BACKGROUND

The following relates to lithography developing processes, and more generally to similar semiconductor fabrication processes, and to apparatuses for performing same, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical lithography development process performed in a semiconductor fabrication facility as part of an integrated circuit (IC) manufacturing process includes depositing a photoresist to a photoresist on the wafer, exposing the photoresist to light using a mask to control the light exposure, and developing the photoresist. The development step includes applying a developer fluid to the photoresist to dissolve resist in areas exposed to the light (in the case of positive photoresist) or to dissolve resist in areas not exposed to the light (in the case of negative photoresist). The developer can be applied to the semiconductor wafer by immersion, spray, puddle, wet spin, or another technique. For deep ultraviolet (DUV) or extreme ultraviolet (EUV) lithography to achieve small feature size additional steps may be performed, such as a post-exposure bake (PEB) to provide chemical amplification, and performing a deionized water (DI) pre-rinse to the semiconductor wafer prior to applying the developer. In the case of DUV or EUV lithography using a chemically amplified (CA) photoresist, photoacids are produced during the exposure step by a photo-acid generator component of the CA resist. A hard bake may be performed after the development to improve structural stability of the developed photoresist pattern.

However, in experiments reported herein, it has been observed that in some IC manufacturing processes, the device yield is lower than desired. Forensic inspection performed at different stages of the development process found that some failure modes that can occur during the development process relate to lithographic pattern failure during the development step. In lithographic pattern failure, pattern melting occurs. This can lead to bridge defects, arcing defects, and/or the like. The forensic inspection disclosed herein also found that pattern failure tended to occur mostly at the center of the wafer.

As further disclosed herein, and without being limited to any particular theory of operation, it is believed that at least some of the observed lithographic pattern failure events relate to static electric charge buildup in the central region of the semiconductor wafer. Lithographic pattern failures such as bridge and arcing defects are induced by charging of nonmetallic pipes used to deliver process fluids. For example, due to friction, static electric charge is generated and accumulated in non-$CO_2$ deionized water (DI) piping, developer (e.g., tetramethylammonium hydroxide, i.e. TMAH) piping, and/or other piping used in the development process. During operation, the fluid from these nonmetallic pipes are believed to deposit electrons at the wafer surface. This causes static electricity accumulation on the wafer surface. The static electric charge buildup at the center region of the wafer (which is where the fluid is delivered in the case of spray delivery) has been observed to occur after a non-$CO_2$ DI pre-rinse which is performed prior to delivery of the developer fluid. Due to this static electric charge buildup in the central region of the wafer, the developer cannot neutralize the photo-acids of the photoresist, and therefore lithographic pattern failure (e.g., pattern melting) occurs at the center region of the wafer.

While particularly observed in the case of DI pre-rinse, such static electric charge buildup is also believed to potentially occur during other steps of the development of a CA photoresist, such as during delivery of the developer fluid itself, or during delivery of a photoresist thinner.

In view of these insights disclosed herein, various embodiments disclosed herein provide approaches for suppressing static electric charge delivery from process fluid piping to the wafer surface. Notably, the pipes providing such fluids to the developer system are electrically grounded to reduce or eliminate static charge generation in the pipes. The electrical grounding of a pipe can be implemented in various ways. In one approach, aluminum foil (Al foil) or another a metal foil is disposed over at least a portion of the pipe, and the metal foil is connected to electrical ground. If the chamber or housing within which the development process is performed is an electrically grounded chamber or housing, then the metal foil may be grounded by way of a grounding strap connecting the metal foil to the chamber or housing. Alternatively, the metal foil can directly contact the grounded chamber at the point where the pipe connects into the chamber or housing to provide the electrical grounding.

In another embodiment, the pipe is electrically grounded by way of an electrically conductive coating disposed on the pipe. In this case, a grounding strap is typically suitably employed to ground the electrically conductive coating to the grounded process chamber or housing or other electrical ground point.

Figure 1:
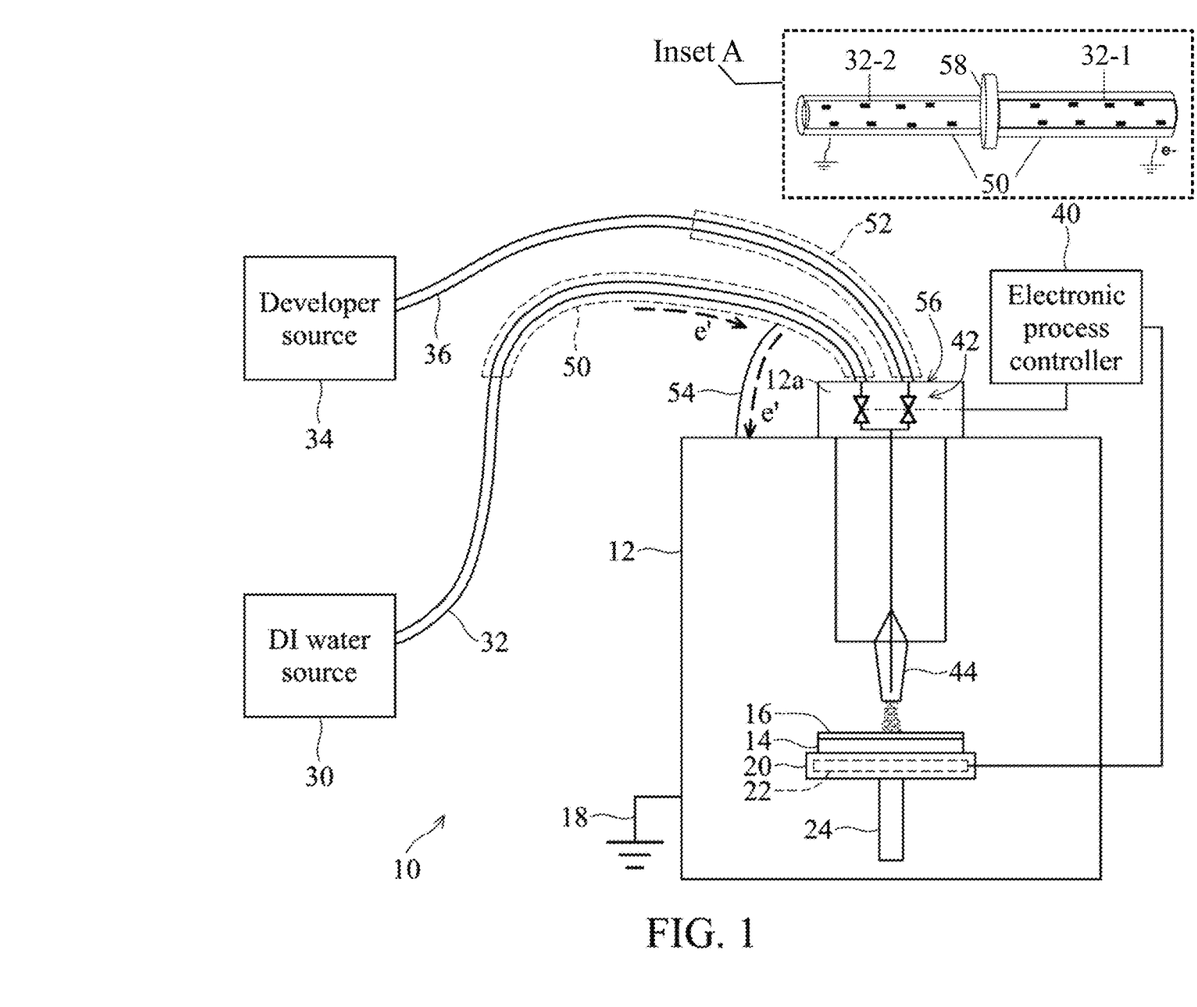
FIG. 1 diagrammatically illustrates an apparatus for performing a lithography development process according to an embodiment.

With reference to FIG. 1, an apparatus for performing a lithography development process is diagrammatically shown. Semiconductor lithography process equipment 10 for performing this process, also referred to herein as a developer system 10, includes a chamber or housing 12 that is configured to contain a semiconductor wafer 14 on which is disposed photoresist 16. The illustrative chamber or housing 12 is an electrically grounded chamber or housing. An electrical ground 18 of the chamber or housing 12 is diagrammatically shown, and can for example be physically implemented by any type of electrical equipment grounding arrangement meeting applicable electrical safety regulations and providing a sufficient electrical ground for performing the development process. The illustrative electrically grounded chamber or housing 12 is configured to contain the semiconductor wafer 14, which is secured in the chamber or housing 12 by a suitable wafer mount 20 that holds the semiconductor wafer 14 using a vacuum chuck, electrostatic chuck, or the like. The wafer mount 20 optionally includes an electric heater 22 for heating the wafer 14 mounted on the wafer mount 20 in order to perform a post-exposure bake (PEB), a hard bake, and/or other thermal processing of the semiconductor wafer 14 as may be appropriate depending on the type of the photoresist 16 and the development process being implemented. In some embodiments, the wafer mount 20 includes a rotatable driveshaft 24 that is connected to a motor (not shown) to enable the semiconductor wafer 14 to be spun during some or all processing steps, for example to perform a spin-on coating operation or to uniformly apply a process fluid or the like.

As the illustrative example of semiconductor lithography development process equipment 10 is used to develop the photoresist 16 on the semiconductor wafer 14, the photoresist 16 is assumed to have already undergone a prior light exposure step in which the photoresist 16 was exposed to light through a photomask to from a latent image in the photoresist 16. The exposure is typically performed in a different apparatus (not shown), such as an EUV or DUV lithography system (not shown). In one nonlimiting illustrative embodiment, the EUV lithography system employs 13 nm EUV light and a reflective mask for the light exposure. In another nonlimiting illustrative example, the exposure may be done using a DUV lithography system, for example using a DUV immersion lithography system employing 193 nm ultraviolet light. The purpose of the development process is then to develop the latent image in the photoresist 16 to remove portions of the photoresist in those areas that were exposed to the light (in the case of positive photoresist), or in those areas that were not exposed to the light (in the case of negative photoresist) and thereby produce a patterned photoresist on the semiconductor wafer 14. In some nonlimiting illustrative embodiments, the photoresist 16 is a chemically amplified (CA) photoresist. As previously noted, a CA photoresist is particularly sensitive to static electrical charge on the surface of the wafer 14, as the static electric charge can interfere with the ability of the developer to neutralize the photo-acids of the CA photoresist 16 thereby leading to lithographic pattern failure.

The illustrative developer system 10 further includes or is connected with a deionized water (DI) source 30 by way of a first pipe 32, and is further connected with a developer source 34 by way of a second pipe 36. The first pipe 32 is connected to deliver DI (or, in other embodiments, another process fluid other than the developer fluid) to the developer system 10, and more particularly to the chamber or housing 12 configured to contain the semiconductor wafer 14. The second pipe 36 is connected to deliver developer fluid to the developer system 10 (and more particularly to the chamber or housing 12 configured to contain the semiconductor wafer 14). One or both pipes 32, 36 are typically nonmetallic pipes. The use of nonmetallic pipes 32, 36 instead of metal pipes is advantageous because DI, developer fluid, or other process fluids flowing through metal pipes can pick up metallic or other contaminants that can be deposited onto the surface of the semiconductor wafer 14 and thereby adversely impact the development process. In some embodiments, the nonmetallic pipe or pipes 32, 36 may be fluoropolymer (PFA) pipes. In other embodiments, the nonmetallic pipes may be made of another type of nonmetallic material such as polytetrafluoroethylene (PTFE). By "nonmetallic" it is meant that the pipe or pipes 32, 36 are not a stainless steel pipe, copper or copper alloy pipe, or other metal pipe. In some embodiments, the electrical conductivity of the nonmetallic pipe or pipes 32, 36 is about the same as the electrical conductivity of PFA. It should also be appreciated that while two process fluid sources 30, 34 for DI and developer fluids, respectively, are illustrated, it is contemplated for the developer system 10 to include or be connected with additional or other process fluids, such a photoresist thinner source or so forth.

The illustrative developer system 10 is automated by way of inclusion of an electronic process controller 40 that controls valves 42 for controlling which fluid source 30, 34 is delivered to a nozzle 44 at any given time. The illustrative nozzle 44 is a spray nozzle for spraying the process fluid onto the surface of the wafer 14, or for performing a wet spin application in conjunction with rotation of the wafer 14 by the driveshaft 24. In variant embodiments, the chamber or housing 12 may be designed to apply process fluids by another application process such as immersion or puddle application (variants not shown). The electronic process controller 40 is also electrically connected to control operation of the optional heater 22 and the motor (not shown)

driving the optional driveshaft 24. The electronic process controller 40 suitably comprises a microprocessor- or microcontroller-based process controller (for example, a computer or a dedicated microprocessor-based programmable electronic controller) that is programmable to control at least the valves 42, the optional heater 22, and the optional driveshaft motor to perform a development process recipe tailored for a particular type of the photoresist 16 and a particular IC manufacturing process lithography patterning step being performed. The electronic process controller 40 may be programmed by way of a suitable non-transitory storage medium (e.g. a flash memory, CMOS memory, magnetic disk, or the like) which stores instructions that are readable and executable by the microprocessor or microcontroller of the electronic process controller 40 to perform the desired development process recipe.

With continuing reference to FIG. 1, as disclosed herein an electrically conductive material 50 is disposed on the outside of the first pipe 32, and similarly an electrically conductive material 52 is disposed on the outside of the second pipe 36. The electrically conductive material 50 disposed on the outside of the first pipe 32 is grounded by a connection to the electrically grounded chamber or housing 12 using a grounding strap 54. The electrically conductive material 52 disposed on the outside of the second pipe 36 is grounded to the electrically grounded chamber or housing 12 by way of a direct galvanic connection 56 of the electrically conductive material 52 to the electrically grounded chamber or housing 12. As diagrammatically indicated in FIG. 1 by dashed arrows indicating flow of electrons (e$^-$) for the electrically conductive material 50, the electrically conductive material 50 disposed on the outside of the first pipe 32 along with the grounding strap 54 serves as an electrical discharge path for static electric charge that might otherwise accumulate in the DI (or other process fluid) flowing through the first pipe 32. Notably, while the nonmetallic pipe 32 is much less electrically conductive than a metal pipe, the nonmetallic pipe 32 suitably comprises PFA-NE tubing (e.g., TOMBO® No. 9003-NE NAFLON PFA-NE tubing, available from Sunrise Valve Ltd., Taiwan) or another type of fluoropolymer (PFA) based tubing or other somewhat electrically conductive nonmetallic tubing which has sufficient electrical conductivity to permit accumulated electrons to gradually discharge through the nonmetallic pipe 32 to the electrically conductive material 50 and grounding strap 54. In this way, the static electric charge is diverted away and does not deposit onto the surface of the wafer 14. Similarly (although not diagrammatically indicated in FIG. 1), the electrically conductive material 52 disposed on the outside of the second pipe 36 along with the direct galvanic connection 56 to the electrically grounded chamber or housing 12 serves as an electrical discharge path for static electric charge that might otherwise accumulate in the developer fluid flowing through the second pipe 36. In this way, that static electric charge is diverted away and does not deposit onto the surface of the wafer 14.

With further reference to FIG. 1, Inset A, in a variant embodiment the first pipe 32 includes a first pipe portion 32-1 that connects with the chamber or housing 12, and a second pipe portion 32-2 that connects with the DI water source 30. The first pipe portion 32-1 and the second pipe portion 32-2 are connected in series by a valve or other pipe connector 58 to form the first pipe 32. In this embodiment, the first pipe portion 32-1 that connects with the chamber or housing 12 comprises PFA-NE or another nonmetallic pipe having sufficient electrical conductivity to transfer electrons from the fluid within the pipe to the electrically conductive material 50 disposed on the outside of the first pipe 32. The second pipe portion 32-2 that is distal from the chamber or housing 12 is more electrically insulating than the first pipe portion 32-1. Thus, the second pipe portion 32-2 can comprise a more electrically insulating material such as high purity PFA-HG tubing (e.g., TOMBO® No. 9003-PFA-HG NAFLON PFA-HG tubing, available from Sunrise Valve Ltd., Taiwan), and optionally can be electrically nonconductive. While Inset A illustrates the electrically conductive material 50 wrapped around and contacting both the first pipe portion 32-1 and the second pipe portion 32-2, in other embodiments it may wrap around or otherwise contact only the more electrically conductive first pipe portion 32-1. Furthermore, while Inset A diagrammatically depicts the variant embodiment for the first pipe 32, it will be appreciated that this arrangement can additionally or alternatively be employed for the second pipe 36.

The electrically conductive material 50 disposed on the outside of the first pipe 32 and the electrically conductive material 52 disposed on the outside of the second pipe 36 can be variously embodied. In one embodiment, the electrically conductive material 50, 52 comprise metal foils, such as aluminum foil, that are wrapped around the respective nonmetallic pipes 32, 36. The metal foil should be packed around the pipe to provide good electrical contact between the metal foil and the nonmetallic pipe. In this embodiment, the galvanic connection 56 of the metal foil 52 wrapped around the second pipe 36 to the electrically grounded chamber or housing 12 is suitably achieved by pressing the metal foil 52 located adjacent to the connection of the second pipe 36 to the chamber or housing 12 against a flange or valve box 12a of the chamber or housing 12 to which the second pipe 36 is connected. If the chamber or housing 12 is not electrically grounded, then the metal foils 50, 52 can be grounded to another suitable electrical ground point, such as a grounded housing of the DI water source 30 and/or developer source 34, or a ground line of a nearby electrical cord, or so forth.

In another embodiment, the electrically conductive material 50 disposed on the outside of the first pipe 32 and the electrically conductive material 52 disposed on the outside of the second pipe 36 can comprise electrically conductive coatings applied to the respective first and second pipes 32, 36. For example, the electrically conductive coatings can be metal coatings. In this case, the illustrative direct connection 56 of the electrically conductive coating 52 disposed on the outside of the second pipe 36 is suitably replaced by a grounding strap analogous to the grounding strap 54 used to ground the electrically conductive material 50 disposed on the outside of the first pipe 32.

It should be noted that the electrically conductive material 50 does not necessarily cover the entire length of the first pipe 32; and likewise, the electrically conductive material 52 does not necessarily cover the entire length of the first pipe 36. If the entire length of the pipe is not covered, then the electrically conductive material should cover the portion of the pipe that connects to the chamber or housing 12, as illustrated in FIG. 1. This ensures that the desired discharge of static electricity (e$^-$) occurs (at least) at the end of the pipe 32, 36 where it connects with the chamber or housing 12. As illustrated in FIG. 1, the end of the first pipe 32 connecting to the DI water source 30 is optionally left uncovered; and likewise, the end of the second pipe 36 connecting to the developer source 34 is optionally left uncovered. This is because any static electrical charge developing in the DI or other process fluid flowing through the end of the first pipe 32 connected to the DI source 30 flows toward the chamber or housing 12 and thus passes through the portion of the first pipe 32 that is covered by the electrically conductive material 50, so that static electrical charge is discharged through the electrically conductive material 50 and grounding strap 54. Likewise, any static electrical charge developing in the developer flowing through the end of the second pipe 36 connected to the developer fluid source 34 flows toward the chamber or housing 12 and thus passes through the portion of the second pipe 36 that is covered by the electrically conductive material 52, so that static electrical charge is discharged through the electrically conductive material 52 and its direct galvanic connection 56 to the grounded chamber or housing 12.

Figure 2:
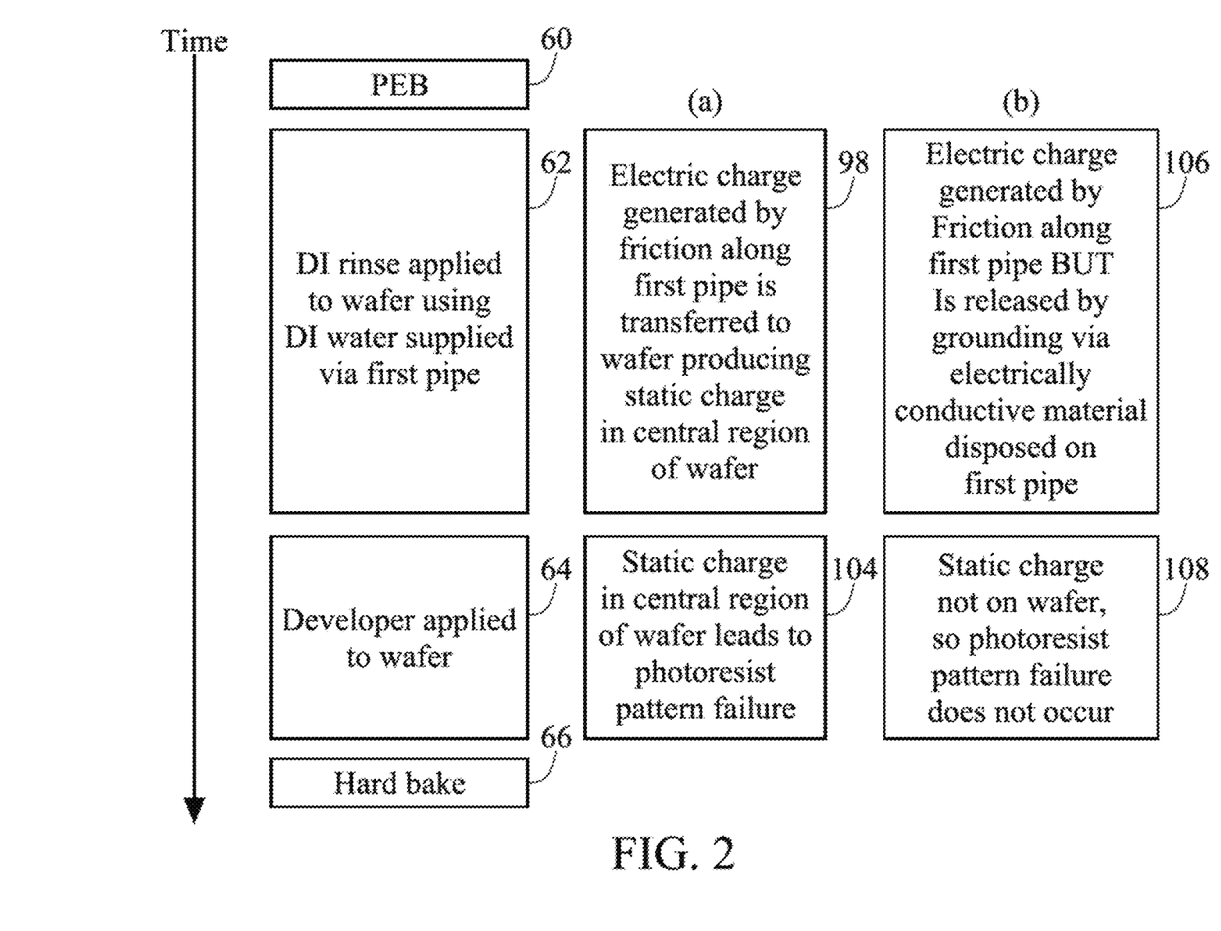
FIG. 2 diagrammatically illustrates a lithography development process according to an embodiment, including diagrammatic depiction of: (a) static charge buildup when not using a grounded DI delivery pipe, and (b) lack of static charge buildup when using a grounded DI delivery pipe.

With continuing reference to FIG. 1 and with further reference to FIG. 2, a typical development process is illustrated. FIG. 2 illustrates a development process as a function of time (vertical axis). It should be noted that the time direction is not necessarily to scale, that is, the vertical dimension of blocks 60, 62, 64, 66 representing the various process steps does not necessarily represent the actual time entailed in performing those respective process steps. It is also emphasized that the development process depicted in FIG. 2 is merely a nonlimiting illustrative example. Moreover, prior to the illustrative development process of FIG. 2, the photoresist 16 on the wafer 14 is assumed to have already undergone a prior light exposure step to form a latent image in the photoresist 16, and the development process of FIG. 2 operates to develop the latent image formed by the light exposure by removing portions of the photoresist in those areas that were exposed to the light (in the case of positive photoresist), or in those areas that were not exposed to the light (in the case of negative photoresist). As previously noted, in some embodiments the photoresist 16 is a chemically amplified (CA) photoresist. Depending on the type of photoresist and other factors, a post-exposure bake (PEB) 60 may optionally be performed. This can be done in a dedicated PEB oven (not shown) before placing the wafer 14 into the development system chamber or housing 12, or can be done after placing the wafer 14 into the development system chamber or housing 12 using the illustrative optional integral heater 22, optionally under automated control of the electronic process controller 40. In the case of some types of CA photoresists, the optional PEB 60 may operate to continue the photoacid catalysis that was initiated by the light exposure.

In an operation 62, a DI pre-rinse is performed prior to delivery of the developer fluid. The DI rinse 62 is performed by opening a valve of the valving 42 under control of the electronic process controller 40 (or, alternatively, by manually opening the valve in the case of a manual development system) to flow DI from the DI water source 30, through the first pipe 32 into the chamber or housing 12 and then out of the nozzle 44 onto the surface of the wafer 14. In a typical approach, the nozzle 44 directs the DI onto the central region of the wafer 14, which is being spun via the driveshaft 24 during the DI rinse step 62 to cause the DI to flow from the center of the wafer 14 radially outward to provide laminar flow of DI across the surface of the wafer 14, thereby rinsing any particulates or contaminants outward and off the surface of the wafer 14. In some embodiments, the DI water source 30 supplies non-$CO_2$ DI water (that is, DI water with a dissolved carbon dioxide level below a specified threshold level) to avoid contaminating the surface of the wafer 14 with hydrocarbons.

In an operation 64, the developer is applied to the surface of the semiconductor wafer 14. To this end, the electronic process controller 40 controls the valving 42 to close the valve for the DI water and open the valve to flow developer fluid from the developer source 34, through the second pipe 36 into the chamber or housing 12 and then out of the nozzle 44 onto the surface of the wafer 14. In a typical approach, the nozzle 44 directs the developer fluid onto the central region of the wafer 14, which is being spun via the driveshaft 24 during the developer application step 62 to cause the developer fluid to flow from the center of the wafer 14 radially outward to provide laminar flow of developer fluid across the surface of the wafer 14, thereby uniformly developing the latent image in the photoresist 16. The developer fluid and its time of application is suitably chosen based on the type of photoresist 16 that has been coated onto the wafer 14 and the particular photolithographic patterning being performed. By way of nonlimiting illustrative example, some embodiments in which the photoresist is a CA photoresist, the developer fluid is comprises tetramethylammonium hydroxide (TMAH) and is intended to operate, in part, by neutralizing the photo-acids of the CA photoresist 16 thereby stabilizing the developed photoresist pattern.

In an optional operation 66, a hard bake may be performed after the developer has been applied. The hard bake 66, if performed at all, can be done in a dedicated hard bake oven after removal of the wafer 14 from the development system chamber or housing 12 and placement into the oven; or the hard back 66 can be done while the wafer 14 with the developed photoresist is still in the development system chamber or housing 12 using the illustrative optional integral heater 22, optionally under automated control of the electronic process controller 40. The optional hard bake 66 may operate to increase stability of the developed photoresist pattern. The choice of whether to perform the optional hard bake 66 is determined based on the type of the photoresist 16.

The illustrative development process of FIG. 2 is merely a nonlimiting example. A given development process may omit one or more of the PEB 60, the DI pre-rinse 62, or the hard bake 66; and/or may include addition process operations not shown, such as an additional process step or steps to assist in stabilizing the developed photoresist pattern.

Some photoresist development processes were actually-performed without electrically conductive material disposed on the process fluid pipes. That is, the actually-performed development processes were performed without the electrically conductive material 50 disposed on the outside of the first pipe 32, and similarly without the electrically conductive material 52 is disposed on the outside of the second pipe 36. The actually-performed development process included the DI pre-rinse step 62 and the developer application step 64 described with reference to FIG. 2, with the nozzle 44 depositing the DI and then the developer at the center of the wafer 14 with the wafer spinning. The DI fluid applied in the pre-rinse 62 was non-$CO_2$ DI, and the developer fluid applied in the step 64 was TMAH. In subsequent forensic examination of the developed photoresist pattern, scanning electron microscopy (SEM) imaging of the developed photoresist revealed lithographic pattern failure occurred during the development step. The lithographic pattern failure was observed in the SEM imaging of the wafer performed after the development process as pattern melting as defects and defective regions such as bridge defects, arcing defects, and/or the like. The SEM imaging also found that pattern failure tended to occur mostly in the central region of the wafer.

It was determined that the observed lithographic pattern failure events relate to static electric charge buildup in the central region of the semiconductor wafer. Due to such static electric charge buildup in the central region of the wafer, the developer cannot neutralize the photo-acids of the photoresist (which was a chemically amplified photoresist in the actually-performed development processes), and therefore lithographic pattern failure occurred at the center region of the wafer.

Figure 3:
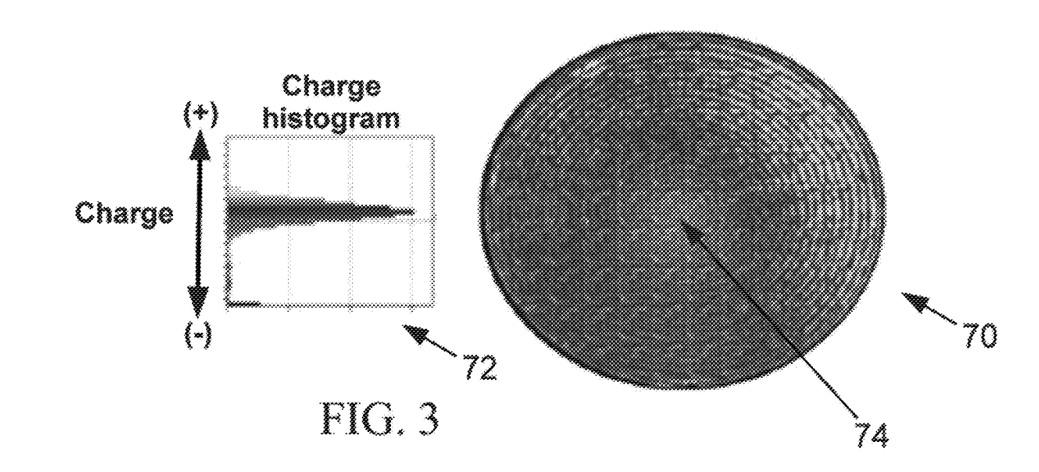
FIG. 3 shows measured static charge data for a 300 mm silicon wafer before the DI rinse of the lithography development process of FIG. 2, including a static charge histogram and a charge map of the wafer.
Figure 4:
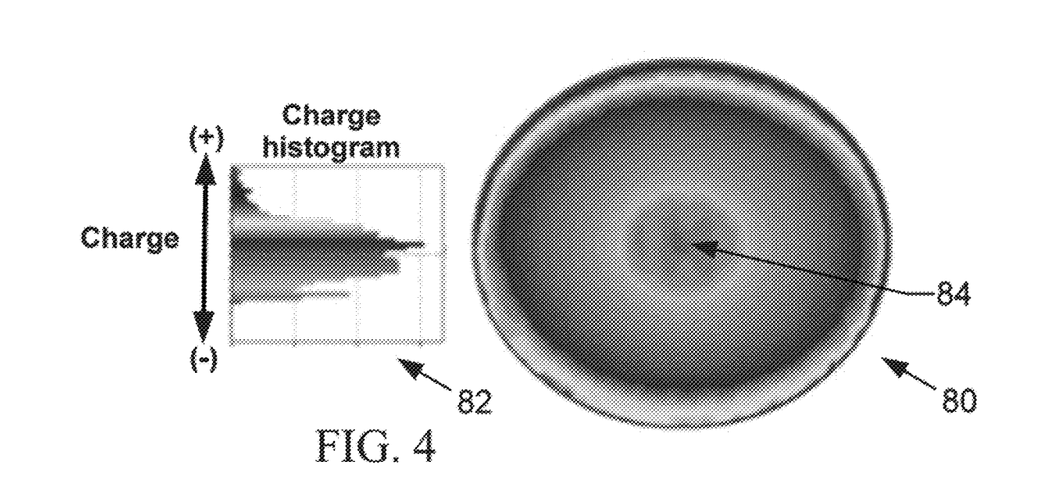
FIG. 4 shows measured static charge data for a 300 mm silicon wafer after the DI rinse of the lithography development process of FIG. 2, including a static charge histogram and a charge map of the wafer.

With reference to FIGS. 3 and 4, to establish that surface charge deposition in the central region of the wafer 14 occurred during the DI rinse step 62, surface charge mapping was used to verify the presence of the charge buildup after the DI rinse step 62 of the development process of FIG. 2. FIG. 3 presents a charge map 70 and corresponding charge histogram 72 of the semiconductor wafer before the DI rinse 62. As can be seen, the static charge map exhibits substantial uniformity across the surface of the wafer, with only a small amount of excess static charge in the central region 74 of the wafer. The substantial uniformity of the charge over the surface of the wafer is also seen in the narrow peak of the charge histogram 72. By comparison, FIG. 4 presents a charge map 80 and corresponding charge histogram 82 of the semiconductor wafer after the DI rinse 62. As can be seen, the charge map 80 does exhibit substantial static charge buildup in a central region 84 of the wafer, and the static charge is nonuniform across the surface of the wafer as exhibited by the broad peak of the charge histogram 82.

Figure 5:
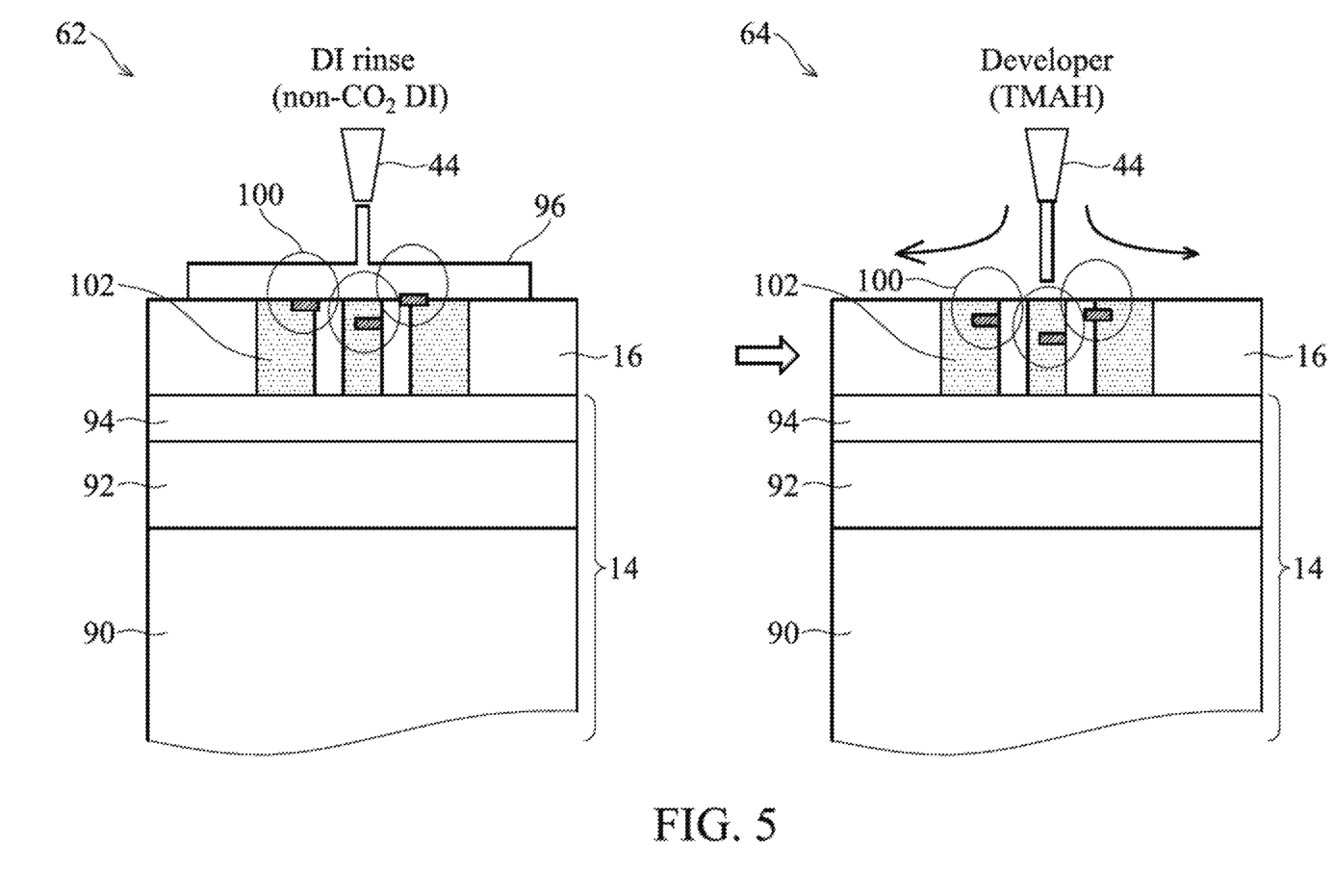
FIG. 5 diagrammatically illustrates static charge buildup when performing the lithography development process of FIG. 2 in the case of not using a grounded DI delivery pipe, with the left drawing showing the DI rinse step and the righthand drawing showing the developer application step.

With reference back to FIG. 2 and with further reference to FIG. 5, and without being limited to any particular theory of operation, the accumulation of static charge during the pre-rinse when performed without the electrically conductive material 50 disposed on the outside of the first pipe 32, and its effect leading to lithographic pattern failure, is diagrammatically shown in FIG. 5, and its effects are indicated in column (a) of FIG. 2. The illustrative example shows the semiconductor wafer 14 comprising a silicon substrate 90 on which is disposed a bottom layer 92 and a middle layer 94, with the photoresist 16 disposed on top of the middle layer 94. Such a structure is commonly used in some types of lithographically controlled processes, for example to enable formation of openings using etches that cannot be masked by the photoresist 16 alone. For example, after patterning the photoresist by exposure and the development process of FIG. 2, a first etchant may be used to extend the openings in the patterned photoresist 16 through the middle layer 94, and this patterned middle layer then serves as a mask for a different etch used to extend the openings through the bottom layer 92. This again is merely one nonlimiting illustrative example.

The left diagram of FIG. 5 diagrammatically depicts the DI pre-rinse step 62 of the process of FIG. 2. This operation flows DI water 96 over the surface of the wafer 14 to rinse the photoresist 16 prior to development. However, as indicated by explanation 98 in FIG. 2, in the absence of the use of the electrically conductive material 50 disposed on the outside of the first pipe 32, during the DI rinse 62 electric charge generated by friction along first pipe 32 is transferred to the wafer 14 producing static charge 102 in a central region of the wafer 14. Thus, the DI rinse 62 deposits static electric charge 100 onto the surface of the wafer 14, and more particularly on or in the photoresist 16. Notably, the static electric charge 100 is deposited in the central region of the wafer 14 and in regions 102 of the latent image formed in the photoresist 16 that are to be removed by the subsequent development step 64. During the subsequent development application step 64 (right diagram of FIG. 5), the static charge 102 blocks the developer fluid from neutralizing the photo-acids of the photoresist 16 (which again is considered to be a CA photoresist in this example), and therefore lithographic pattern failure occurs in these regions 102, as also described in the explanation 104 in FIG. 2. That is, the static charge 102 in the central region of wafer 14 leads to photoresist pattern failure.

By contrast, as indicated by explanations 106 and 108 in column (b) of FIG. 2, when the DI rinse 62 is performed with the electrically conductive material 50 disposed on the outside of the first pipe 32, electric charge is again generated by friction along first pipe—but the electric charge is released by grounding via the electrically conductive material 50 disposed on first pipe 32 (see explanation 106). Hence, in the subsequent developer application step 64, static charge is not on wafer 14, so photoresist pattern failure does not occur (see explanation 108).

The results of FIGS. 3 and 4 relate to charge buildup in the central area of the surface of the wafer 14 during the DI rinse step 62. However, it is anticipated that such charge buildup could also occur during the developer application step 64, due to charge frictionally generated in the second pipe 36 due to flow of the developer fluid being deposited onto the surface of the semiconductor wafer 14. To combat this, the electrically conductive material 52 disposed on the second pipe 36 carrying the developer fluid operates analogously to the electrically conductive material 50 disposed on the first pipe 32, to discharge the electrical charge produced in the developer fluid to electrical ground via the electrically conductive material 52 and (in the example of FIG. 1) its direct connection 56 to the electrically grounded chamber or housing 12.

Even more generally, the approach is expected to be useful in semiconductor lithography process equipment (of which the developer system 10 is an example) in which at least one nonmetallic pipe connected with the semiconductor lithography equipment (of which first and second pipes 32, 36 are examples). In this generalized case, an electrically conductive material is suitably disposed on an outside of the at least one nonmetallic pipe (corresponding to electrically conductive materials 50, 52 of FIG. 1), and is connected to release charge from the at least one nonmetallic pipe to an electrical ground (e.g., via the grounding strap 54 and the direct connection 56 in the example of FIG. 1).

In the following, some further embodiments are described.

In a nonlimiting illustrative embodiment, a semiconductor manufacturing method operating on a semiconductor wafer is disclosed. The method comprises performing a deionized (DI) water rinse of the semiconductor wafer by flowing DI water through a nonmetallic pipe and onto the semiconductor wafer and, during the DI water rinse, discharging static electric charge from the DI water flowing through the nonmetallic pipe via an electrically conductive material disposed on an outside of the nonmetallic pipe. The electrically conductive material disposed on the outside of the nonmetallic pipe is electrically grounded. In some embodiments, the nonmetallic pipe comprises fluoropolymer (PFA) based tubing.

In a nonlimiting illustrative embodiment, a semiconductor manufacturing method operating on a semiconductor wafer is disclosed. The method comprises: applying a process fluid to the semiconductor wafer; during the applying of the process fluid, supplying the process fluid that is applied via a nonmetallic pipe; and during the applying of the process fluid, discharging static electricity from the nonmetallic pipe via an electrically grounded electrically conductive material disposed on the outside of the nonmetallic pipe. In some embodiments, the process fluid comprises deionized water (DI).

In a nonlimiting illustrative embodiment, a semiconductor manufacturing method comprises flowing a process fluid through a nonmetallic pipe onto a semiconductor wafer disposed in a chamber or housing, and releasing charge from the process fluid in the nonmetallic pipe to the chamber or housing via an electrically conductive material disposed on an outside of the nonmetallic pipe and in electrical contact with the chamber or housing. In some embodiments, the nonmetallic pipe comprises a PFA-NE pipe connected with the chamber or housing, a second pipe connected with the PFA-NE pipe, and a pipe connector connecting the PFA NE pipe and the second pipe in series, wherein the second pipe is more electrically insulating than the PFA-NE pipe.

In a nonlimiting illustrative embodiment, an apparatus comprises: a developer system configured to develop photoresist disposed on a semiconductor wafer; a developer fluid delivery pipe connected to deliver a developer fluid to the developer system; a fluoropolymer (PFA) pipe connected to deliver a process fluid other than the developer fluid to the developer system; and an electrically conductive material disposed on an outside of the PFA pipe. The developer system is configured to apply developer fluid from the developer fluid delivery pipe to the semiconductor wafer and to apply process fluid from the PFA pipe to the semiconductor wafer. The electrically conductive material disposed on the outside of the PFA pipe is electrically grounded. In some embodiments, the PFA pipe is connected to deliver the process fluid comprising deionized water (DI) to the developer system. In some such embodiments, the developer system is configured to develop the photoresist disposed on the semiconductor wafer by process operations including spraying DI from the PFA pipe onto the wafer, and after the spraying of the DI, spraying developer fluid from the developer fluid delivery pipe onto the wafer.

In a nonlimiting illustrative embodiment, a method of developing photoresist disposed on a semiconductor wafer, is disclosed. The method comprises: performing a deionized (DI) water rinse of the photoresist disposed on the semiconductor wafer by flowing DI water through a nonmetallic pipe and onto the photoresist; during the DI water rinse, discharging static electric charge from the DI water flowing through the nonmetallic pipe via an electrically conductive material disposed on an outside of the nonmetallic pipe; and after the DI water rinse, developing the photoresist by flowing a developer fluid through a second pipe and onto the photoresist. The electrically conductive material disposed on the outside of the nonmetallic pipe is electrically grounded.

In a nonlimiting illustrative embodiment, a method of developing photoresist disposed on a semiconductor wafer includes applying a process fluid to the semiconductor wafer. During the applying of the process fluid, the process fluid that is applied is supplied via a nonmetallic pipe. Also during the applying of the process fluid, static electricity from the nonmetallic pipe is discharged via an electrically grounded electrically conductive material disposed on the outside of the nonmetallic pipe. After the applying of the process fluid, a developer fluid is applied to the semiconductor wafer. In some embodiments, the process fluid comprises deionized water (DI).

In a nonlimiting illustrative embodiment, a method of developing photoresist disposed on a semiconductor wafer includes applying a process fluid to the semiconductor wafer. During the applying of the process fluid, the process fluid that is applied is supplied via a nonmetallic pipe. Also during the applying of the process fluid, static electricity from the nonmetallic pipe is discharged via an electrically grounded electrically conductive material disposed on the outside of the nonmetallic pipe. After the applying of the process fluid, a developer fluid is applied to the semiconductor wafer. During the applying of the developer fluid, the developer fluid that is applied is supplied via a second nonmetallic pipe. Also during the applying of the developer fluid, static electricity from the second nonmetallic pipe is discharged via a second electrically grounded electrically conductive material which is disposed on the outside of the second nonmetallic pipe.

In a nonlimiting illustrative embodiment, an apparatus comprises: semiconductor lithography process equipment; at least one nonmetallic pipe connected with the semiconductor lithography equipment; and an electrically conductive material disposed on an outside of the at least one nonmetallic pipe and connected to release charge from the at least one nonmetallic pipe to an electrical ground.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing method operating on a semiconductor wafer, the method comprising:
   wrapping a metal foil around an outside of a nonmetallic pipe and electrically grounding the metal foil;
   performing a deionized (DI) water rinse of the semiconductor wafer by flowing DI water through the nonmetallic pipe and spraying the DI water flowed through the nonmetallic pipe onto the semiconductor wafer; and
   during the DI water rinse, discharging static electric charge from the DI water flowing through the nonmetallic pipe via the metal foil wrapped around the outside of the nonmetallic pipe.

2. The method of claim 1 wherein the nonmetallic pipe comprises fluoropolymer (PFA) based tubing and the metal foil is aluminum foil.

3. The method of claim 1 wherein the flowing of the DI water through the nonmetallic pipe and spraying the DI water flowed through the nonmetallic pipe onto the semiconductor wafer comprises:
   flowing non-$CO_2$ DI water through the nonmetallic pipe and spraying the non-$CO_2$ DI water flowed through the nonmetallic pipe onto the semiconductor wafer.

4. The method of claim 1 further comprising:
   prior to the DI water rinse, mounting the semiconductor wafer on a wafer mount in an electrically grounded chamber or housing;
   wherein electrically grounding the metal foil includes electrically connecting the metal foil wrapped around the outside of the nonmetallic pipe to the electrically grounded chamber or housing by a grounding strap.

5. The method of claim 1 further comprising:
   prior to the DI water rinse, mounting the semiconductor wafer on a wafer mount in an electrically grounded chamber or housing;

wherein electrically grounding the metal foil includes contacting the metal foil wrapped around the outside of the nonmetallic pipe directly to the electrically grounded chamber or housing, and the metal foil is wrapped around a portion of the length of the nonmetallic pipe that connects to the electrically grounded chamber or housing but does not cover a portion of the length of the nonmetallic pipe distal from the electrically grounded chamber or housing.

6. The method of claim 1 wherein the DI water rinse flows the DI water through the nonmetallic pipe and sprays the DI water flowed through the nonmetallic pipe onto a photoresist disposed on the semiconductor wafer, and the method further comprises:
wrapping a second metal foil around an outside of a second nonmetallic pipe and electrically grounding the second metal foil;
after the DI water rinse, developing the photoresist by flowing a developer fluid through the second nonmetallic pipe and onto the photoresist; and
during the developing, discharging static electric charge from the developer fluid flowing through the second nonmetallic pipe via the second metal foil wrapped around the outside of the second nonmetallic pipe.

7. The method of claim 6 wherein the developer fluid comprises tetramethylammonium hydroxide (TMAH).

8. The method of claim 1 wherein the metal foil wrapped around the outside of the nonmetallic pipe does not extend over the entire length of the nonmetallic pipe.

9. A semiconductor manufacturing method operating on a semiconductor wafer in a process chamber, the method comprising:
disposing a metal foil on an outside of a nonmetallic pipe;
electrically grounding the metal foil;
applying deionized (DI) water to the semiconductor wafer in the process chamber via the nonmetallic pipe; and
during the applying of the DI water, discharging static electricity from the nonmetallic pipe via the electrically grounded metal foil which is disposed on the outside of the nonmetallic pipe, wherein the electrically grounded metal foil extends over a portion of the nonmetallic pipe connected with the process chamber but does not extend over a portion of the nonmetallic pipe distal from the process chamber.

10. The method of claim 9 wherein the applying of the DI water to the semiconductor wafer comprises spraying the DI water onto the semiconductor wafer.

11. The method of claim 9 further comprising:
disposing a second metal foil on an outside of a second nonmetallic pipe;
electrically grounding the second metal foil;
after the applying of the DI water, applying a developer fluid to the semiconductor wafer in the process chamber via the second nonmetallic pipe; and
during the applying of the developer fluid, discharging static electricity from the second nonmetallic pipe via the second electrically grounded metal foil which is disposed on the outside of the second nonmetallic pipe.

12. The method of claim 11 wherein:
the applying of the DI water to the semiconductor wafer comprises spraying the DI water onto the semiconductor wafer; and the applying of the developer fluid comprises spraying the developer fluid onto the semiconductor wafer.

13. The method of claim 9 wherein the nonmetallic pipe comprises:
a first nonmetallic pipe portion connected with the process chamber; and
a second nonmetallic pipe portion distal from the process chamber and connected with the first pipe portion by a pipe connector;
wherein the second nonmetallic pipe portion is more electrically insulating than the first nonmetallic pipe portion.

14. The method of claim 9 wherein the electrical grounding of the metal foil includes:
electrically grounding the metal foil via a grounding strap connected to an electrical ground.

15. The method of claim 9 wherein the process chamber is an electrically grounded process chamber, and the electrical grounding of the metal foil includes:
electrically grounding the metal foil via direct contact of the metal foil to the electrically grounded process chamber with which the nonmetallic pipe is connected.

16. A semiconductor manufacturing method comprising:
wrapping a metal foil only on an outside of a nonmetallic pipe;
flowing deionized (DI) water through the nonmetallic pipe onto a semiconductor wafer disposed in semiconductor lithography process equipment; and
during the flowing, releasing charge from the DI water flowing through the nonmetallic pipe to the semiconductor lithography process equipment via the metal foil disposed only on the outside of the nonmetallic pipe.

17. The method of claim 16 wherein the nonmetallic pipe comprises:
a PFA-NE pipe connected with a chamber or housing of the semiconductor lithography process equipment;
a second pipe connected with the PFA-NE pipe; and
a pipe connector connecting the PFA-NE pipe and the second pipe in series;
wherein the second pipe is more electrically insulating than the PFA-NE pipe; and
wherein the metal foil is wrapped only on the outside of the PFA-NE pipe.

18. The method of claim 16 wherein the wrapping of the metal foil only on the outside of the nonmetallic pipe comprises:
wrapping the metal foil completely around only the outside of the nonmetallic pipe.

19. The method of claim 16 wherein the wrapping of the metal foil only on the outside of the nonmetallic pipe comprises:
wrapping aluminum foil around only the outside of the nonmetallic pipe.

20. The method of claim 16 wherein the flowing of DI water through the nonmetallic pipe onto the semiconductor wafer disposed in semiconductor lithography process equipment comprises:
flowing the DI water through the nonmetallic pipe and spraying the DI water flowed through the nonmetallic pipe onto the semiconductor wafer disposed in semiconductor lithography process equipment.

* * * * *